United States Patent [19]

Varadarajan

[11] Patent Number: 4,737,663
[45] Date of Patent: Apr. 12, 1988

[54] CURRENT SOURCE ARRANGEMENT FOR THREE-LEVEL EMITTER-COUPLED LOGIC AND FOUR-LEVEL CURRENT MODE LOGIC

[75] Inventor: Hemmige D. Varadarajan, Sunnyvale, Calif.

[73] Assignee: Advanced Micro Devices, Inc., Sunnyvale, Calif.

[21] Appl. No.: 585,315

[22] Filed: Mar. 1, 1984

[51] Int. Cl.[4] .......................................... H03K 19/086
[52] U.S. Cl. .................... 307/455; 307/454; 307/297; 323/314
[58] Field of Search ............... 307/443, 454, 455, 459, 307/477, 296 R, 297; 323/313–315

[56]     References Cited

U.S. PATENT DOCUMENTS

| | | | |
|---|---|---|---|
| 3,519,810 | 7/1970 | Priel et al. | 307/455 X |
| 3,686,512 | 8/1972 | Kroos | 307/455 |
| 3,893,018 | 7/1975 | Marley | 323/313 |
| 4,041,326 | 8/1977 | Robinson | 307/455 X |
| 4,215,418 | 7/1980 | Muramatsu | 307/455 X |
| 4,249,091 | 2/1981 | Yamagiwa | 307/455 |
| 4,442,399 | 4/1984 | Nagano | 307/296 R X |

Primary Examiner—Stanley D. Miller
Assistant Examiner—D. R. Hudspeth
Attorney, Agent, or Firm—Patrick T. King; Norman E. Reitz; J. Vincent Tortolano

[57]     ABSTRACT

Three-level ECL or four-level CML are feasible when a low drop current source is incorporated in the series-gated arrangement. The low drop current source consumes less than one-tenth of the voltage span between $V_{CC}$ and ground. A greater portion of the voltage span between $V_{CC}$ and ground, up to 4 volts, is therefore reserved for the three ECL levels or four CML levels of logic. Conventional power supplies are utilized yet the number of logic functions is increased.

19 Claims, 6 Drawing Sheets

FIG. 6

CURRENT SOURCE ARRANGEMENT FOR THREE-LEVEL EMITTER-COUPLED LOGIC AND FOUR-LEVEL CURRENT MODE LOGIC

BACKGROUND OF THE INVENTION

1. Field of the Invention

This invention relates to an arrangement for an emitter-coupled logic (ECL) gate or for a current mode logic (CML) gate which permits the series gating of several levels of binary logic and, more particularly, relates to a current source arrangement which requires a low voltage drop thereby allowing a sufficient voltage between $V_{CC}$ and ground to implement three-level ECL and four-level CML.

2. Discussion of Background and Prior Art

As the densities of integrated circuits have increased, the limits of physics, fabrication equipment and process technique are being reached. To further enhance the capability of integrated circuits to perform logic functions, a number of additional steps have been taken or are being considered. A first approach is to use logic schemes of higher order than binary. Thus ternary or quaternary logic has been used. For such higher order logic there are three or four discrete states, respectively, which are permissible on each output line. See, e.g., K. W. Current et al., "Implementing Parallel Counters with Four-Valued Threshold Logic", *IEEE Transactions on Computers*, v. C-28, No. 3, March 1979, p. 200; and K. W. Current, "High Density Integrated Computing Circuitry With Multiple Valued Logic", *IEEE J. of Solid-State Circuits*, v. SC-15, No. 1, February 1980, p. 127.

Another approach has been the use of input lines and output lines interchangeably, i.e., input and output lines have been multiplied, thereby reducing the number of pins required on packaged integrated circuits. This has also permitted the use of a generalized integrated circut such as a programmable read only memory (PROM) for a large number of different, specific applications.

A further approach to obtaining enhanced logic performance out of a given integrated circuit or a given amount of silicon has been the use of series gated devices or Cascode logic. Here, at least two levels of binary logic are stacked on each other. At times, three levels are possible. See, e.g., R. J. Scavuzzo, "EFL Logic Arrays", U.S. Pat. No. 4,378,508; and G. L. Baldwin et al., "Modular, High-Speed Serial Pipeline Multiplier for Digital Signal Processing", *IEEE J. of Solid State Circuits*, v. SC-13, no. 3, p. 400, June 1978. Two level ECL has been used for commercial bipolar integrated circuits such as the Advanced Micro Devices 2901 Bit Slice Microprocessor and the Advanced Micro Devices 29116 16 Bit Microprocessor. In such applications a significant increase in logic is obtained with no increase in production cost. The benefits are obtained because the peripheral devices such as output transistors and input transistors in a given device are shared for each level of logic. More logic functions are performed for a given amount of power consumption, less delay is experienced and less silicon area is required. Similar and additional advantages would accrue if three-level ECL could be accomplished. The barrier to obtaining three-level ECL, as described in detail subsequently, is that power supplies are specified at set voltage values and each level of logic consumes a certain voltage span and the conventional current source takes up so much voltage that only two levels of logic are possible. The voltage span between $V_{CC}$ and $V_{EE}$, ($V_{CC}-V_{EE}$), is accounted for without allowing for an additional level of logic.

It is therefore desirable to provide gate arrangements, and particularly current sources for logic gate arrangements, which allow higher order series level gating to be accomplished.

BRIEF DESCRIPTION OF THE DRAWINGS

For a more complete understanding of the circuit arrangement of the present invention, reference may be had to the accompanying drawings which are incorporated herein by reference and in which.

SUMMARY OF THE INVENTION

Three-level ECL or four-level CML are feasible when a low drop current source is incorporated in the series-gated scheme. In a preferred embodiment a low reference voltage is generated and applied to the base of a current source trnsistor. A greater portion of the voltage span between $V_{CC}$ and ground, up to 4.0 volts, is thereby reserved for the three ECL levels or four CML levels of logic. Conventional power supplies are utilized yet the number of logic functions is increased.

DESCRIPTION OF THE PREFERRED EMBODIMENTS

A "gate" in the lexicon of semiconductor electronics is a circuit which performs a specified logical function and is based on an identified circuit principle. For example, the conventional ECL gate performs an OR/NOR logical operation and has a well known configuration. See, e.g, the *Motorola MECL Data Book*, FIG. 3, pp. 1-4 (1982). Each of the conventional bipolar logic families such as transistor/transistor logic, resistor/transistor logic and injection logic are based on unit circuits or gates which perform a logic function unique to the logic family. Each of these basic building blocks may be used to design integrated circuits that perform a variety of logical operations. Of these various families the one with the highest performance is emitter-coupled logic. With ECL the delay associated with the performance of the logical operation is lower than any other logic family. To enhance performance above this inherent level, however, it is necessary to resort to one of the techniques set out in the Background section.

To optimize the design of circuitry in any given logic family, it is necessary to consider the constraints that exist for devices employing the gates of the logic family. For ECL or CML (see subsequent discussion of distinctions between CML and ECL), the supply voltage $V_{CC}$ level is specified by convention to have a minimum allowable value of 4.3 volts. This convention is based upon the nominal specification of ECL circuits as operating at 5 volts with a tolerance of ±10%. The worst case low voltage from the power supply is thus 5 volts minus 0.1×5 volts or 4.5 volts. With large scale integration, however, there may be an on-chip voltage drop of 200 mv between the input power pin and the most remote circuit. Thus, the very worst power condition for the most remote circuit is 4.5 minus 200 mv or 4.3 volts. Thus, a user could provide a power supply which at some time during operation, e.g., under the least favorable operating conditions, supplies a voltage as low as 4.5 volts and for design purposes the most remote circuit would be considered to have 4.3 volts available as $V_{CC}$. In addition, ECL or CML parts would typically be specified to operate within the full military temperature range, i.e., from −55° C. to +155° C. The worst case occurs at the low end of the temperature range, since all transistors in the circuit will have high base to emitter voltages, $V_{BE}$, on the order of 900 mv. Even at this low temperature a sufficient supply voltage must be provided to allow each transistor to function properly. Thus, as described in detail subsequently, since each level of logic in a series gated or Cascode ECL structure requires that there be at least one $V_{BE}$ drop, the number of levels is limited by the total voltage span available between $V_{CC}$ and $V_{EE}$ after a current source is generated. Finally, in conventional ECL circuits a bandgap reference voltage source is employed which provides a voltage of about 1.6 volts at 25° C. This bandgap reference voltage, typically designated $V_{CS}$, is applied to the base of a transistor which serves as the current source. The high level on the base of this transistor results in a current source which requires too high a voltage drop to prevent saturation thereby using an unacceptably high portion of the voltage between $V_{CC}$ and ground.

To make an ECL gate useful in an integrated circuit it is required that the output have a voltage swing of a minimum magnitude. Thus, this voltage swing or voltage change between the level signifying a logic 1 and the level signifying a logic 0 must be greater than or equal to 750 mv. This requirement stems from the fact that adequate noise immunity is obtained when the signal voltage is plus or minus 375 mv about the reference voltage. This voltage swing for the output is provided by the change in voltage across the resistor connected between the base of the emitter follower and the voltage supply line $V_{CC}$, for example resistor 19 in FIG. 1. Thus, even with the optimum design this resistor must be allocated a voltage drop of 750 mv.

Figure 1:
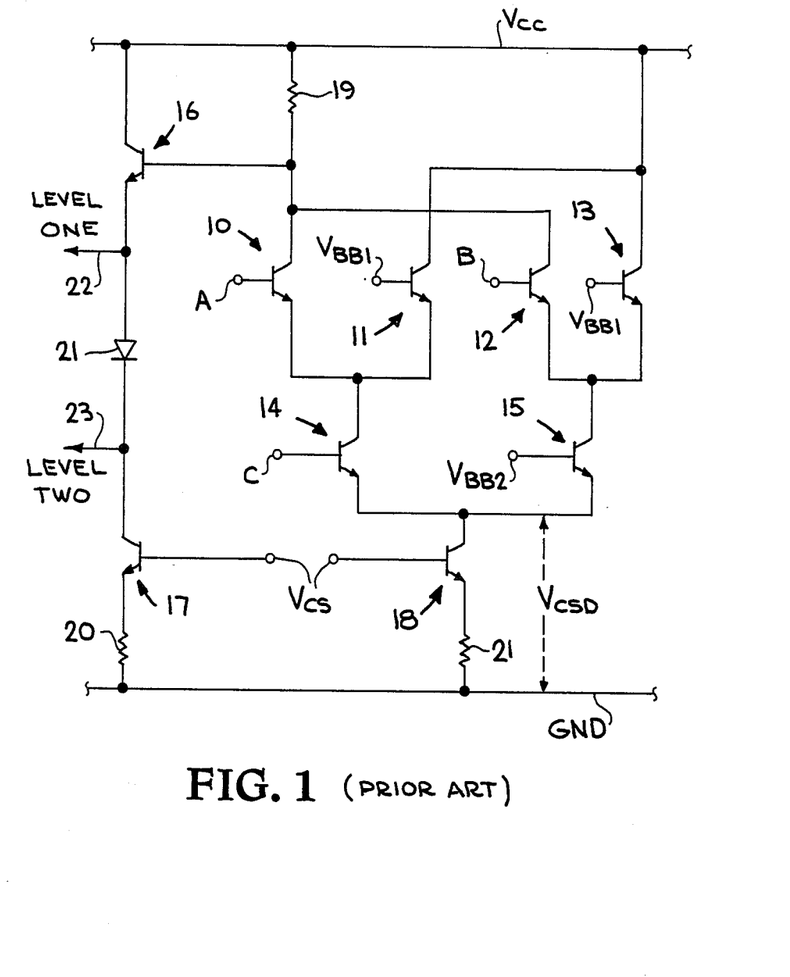
FIG. 1 is a circuit schematic of a dual level ECL gate of the prior art.

As described in the Background section, series gating is a circuit configuration for ECL which permits the stacking of binary logic functions; peripheral devices are shared, device area is conserved and performance is enhanced. A conventional two-level ECL gate in a series gating configuration is shown in FIG. 1. This is commonly called a Cascode arrangement, and has a first level of binary logic implemented by input transistors 10 and 12 which have as their respective inputs the signals A and B and reference transistors 11 and 13 which have as their respective inputs a first reference voltage $V_{BB1}$. The second level of binary logic is implemented by at least a first input transistor 14 which has its base connected to signal C and a reference transistor 15 having its base connected to a second reference voltage $V_{BB2}$. The emitter follower 16, load transistor 17, current source transistor 18 and resistors 19, 20 and 21 are shared by both binary levels of logic. The outputs of the separate levels are to be taken on either side of diode 21, i.e., one level is taken on line 22 and the output of the other level is taken on line 23. Each output has information in a binary format, i.e., for each output a passband of voltages signifies a digital "1" while another passband of voltages signifies a digital "0". The boundaries for the two passbands for each level will be different so that the information in one level is distinguishable from the information in the other level.

Figure 3A:
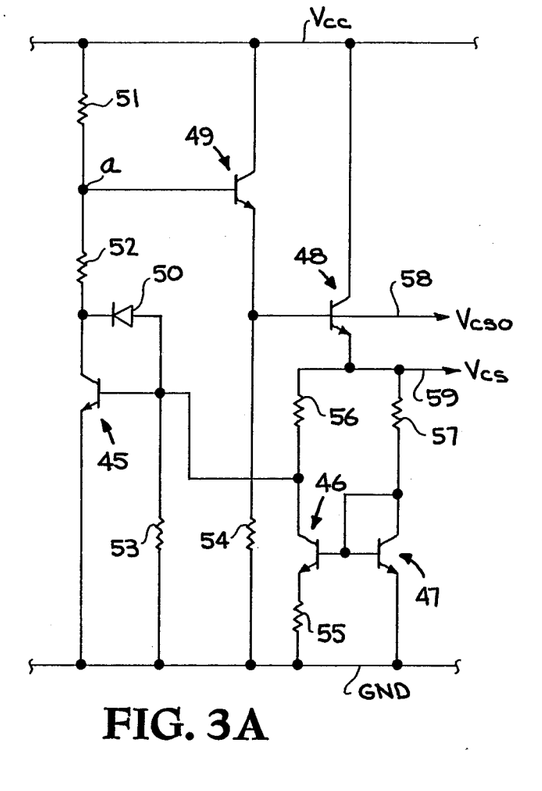
FIGS. 3(a) and 3(b) are schematic diagrams illustrating voltage sources which can be used to drive the low drop current source arrangement of the present invention.
Figure 3B:
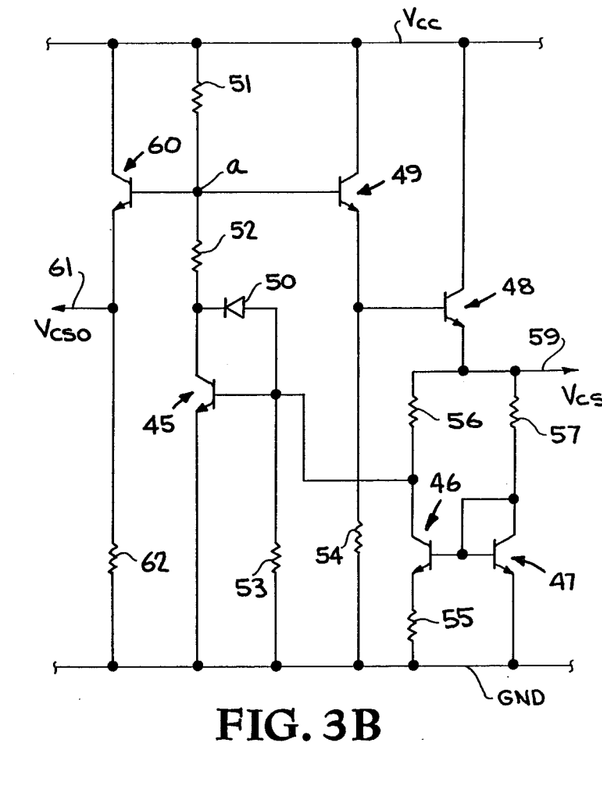

As discussed above, for any 5-volt system there is a minimum voltage span available between $V_{CC}$ and $V_{EE}$ which typically is at ground potential. Thus, in the two-level ECL circuit of FIG. 1 there will be at most 4.3 volts available for the first level of binary logic, the second level of binary logic, the voltage swing on the output (resistor 19) and the current source (transistor 18, resistor 21). The bandgap reference voltage $V_{CS}$ is approximately equal to 1.6 volts because at 25° C. one $V_{BE}$ plus $V_S$ is approximately 1.6 volts. Therefore, the voltage drop across the current source transistor 18, herein designated $V_{CSD}$ and shown by the dotted line to be measured between the collector and ground, is as high as 1 volt, thereby leaving only 3.3 volts for the half voltage swing and the levels of logic in a series-gated scheme. This leaves approximately 2.9 volts for the several levels of logic. Since each level has one $V_{BE}$ drop each requires at least 900 mv, worst case; consequently, only two levels of logic are possible. The voltage swing is a fixed requirement because it is dictated by the voltages required by external circuitry. Therefore, in order to have three levels of logic it is essential to have a low drop current source to leave sufficient voltage for the third level of logic. Or, for CML the low drop current source will permit four levels of logic, as described subsequently with respect to FIG. 6. The circuit arrangement of the present invention provides and utilizes such a low voltage current source. Preferred low voltage references for producing the low drop current sources for the arrangement of the present invention are shown in FIGS. 3(a) and 3(b). Other low voltage references may also be used to drive the arrangement of the present invention. For example, the low voltage bias generator described in the copending patent application of H. Varadarajan, "Bias Circuit For Dynamically Switchable Low Drop Current Source", Ser. No. 550,529, filed on Nov. 9, 1983, may be used to drive a current source in the series-gated scheme.

Figure 2:
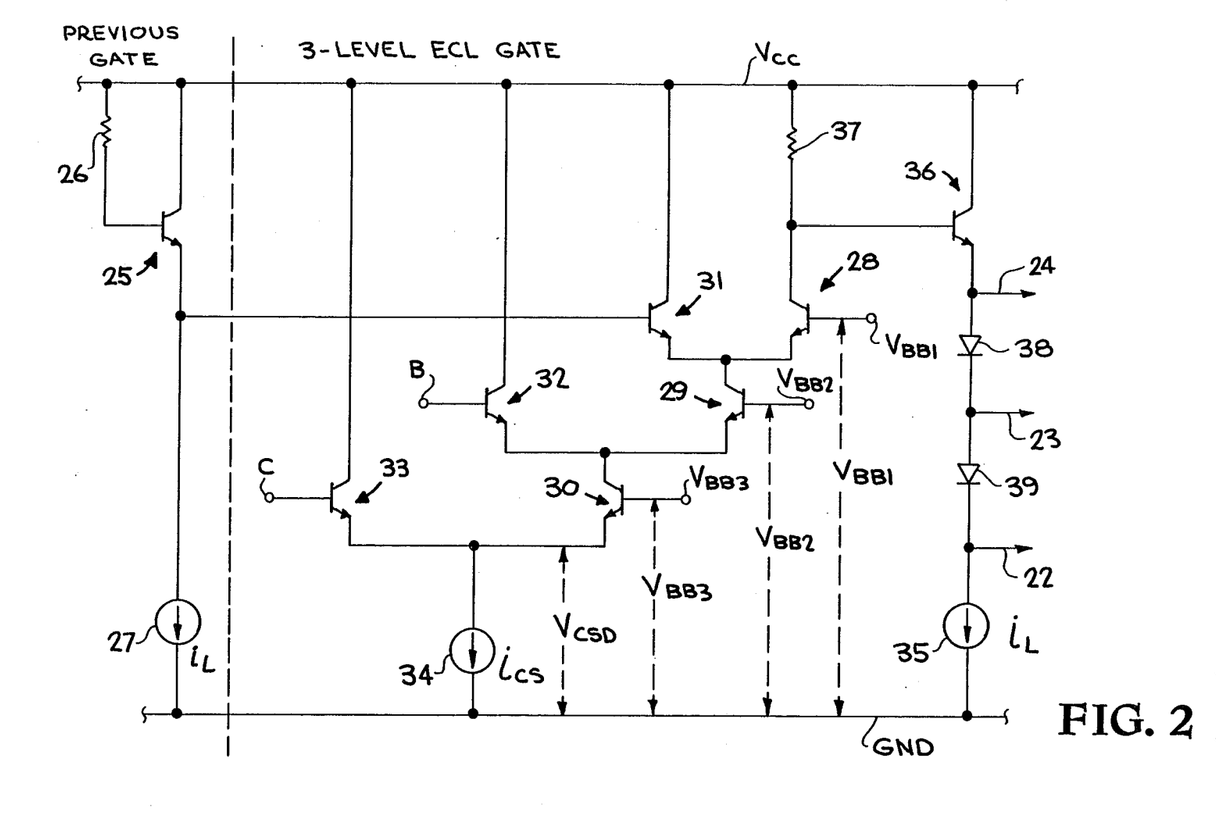
FIG. 2 is a partial circuit schematic of a three-level ECL gate which shows in phantom the voltage drop across each logic level.

The circuit arrangement for a conventional three-level ECL gate is shown in FIG. 2. Here, the first level has a reference transistor 28 with a voltage source $V_{BB1}$ connected to its base and at least one input transistor 31 whose base is connected to the signal A provided on the emitter of transistor 25 of the previous gate shown to the left of the dotted line; the second level has a reference transistor 29 having a reference voltage $V_{BB2}$ connected to its base and at least one input transistor 32 whose base is connected to the signal B provided by the output of a previous gate (not shown); and the third level has a reference transistor 30 having a reference voltage $V_{BB3}$ connected to its base and at least one input transistor 33 whose base is connected to the signal C provided by the output of a previous gate (not shown). Each level may have additional input transistors whose bases are connected to other input signals. For maximum utilization of the voltage span, i.e., to allocate the minimum acceptable voltage to each gate, the reference bias voltages whose levels are indicated in phantom will be set as follows:

$$V_{BB1} = V_{CC} - V_{BE} - \frac{V_S}{2}$$

$$V_{BB2} = V_{CC} - 2V_{BE} - \frac{V_S}{2}$$

$$V_{BB3} = V_{CC} - 3B_{BE} - \frac{V_S}{2}$$

As a result the voltage drop across the current source $V_{CSD}$ will be given by:

$$V_{CSD} = V_{CC} - 4V_{BE} - \frac{V_S}{2}$$

The worst condition is experienced at the low end of the military temperature range when $V_{BE}$ is a maximum, i.e., 900 mv, and $V_{CC}$ is minimum, i.e., 4.3 volts. $V_S$ is set at 750 mv. Thus, for this condition $V_{BB1}=3.025$ v, $V_{BB2}=2.125$ v, $V_{BB3}=1.225$ v, $V_{CSD}=0.325$ v. In order to produce these voltages it is necessary to provide a low drop current source which utilizes 0.325 volts or less. The arrangement of the present invention provides such a low drop current source.

Figure 4:
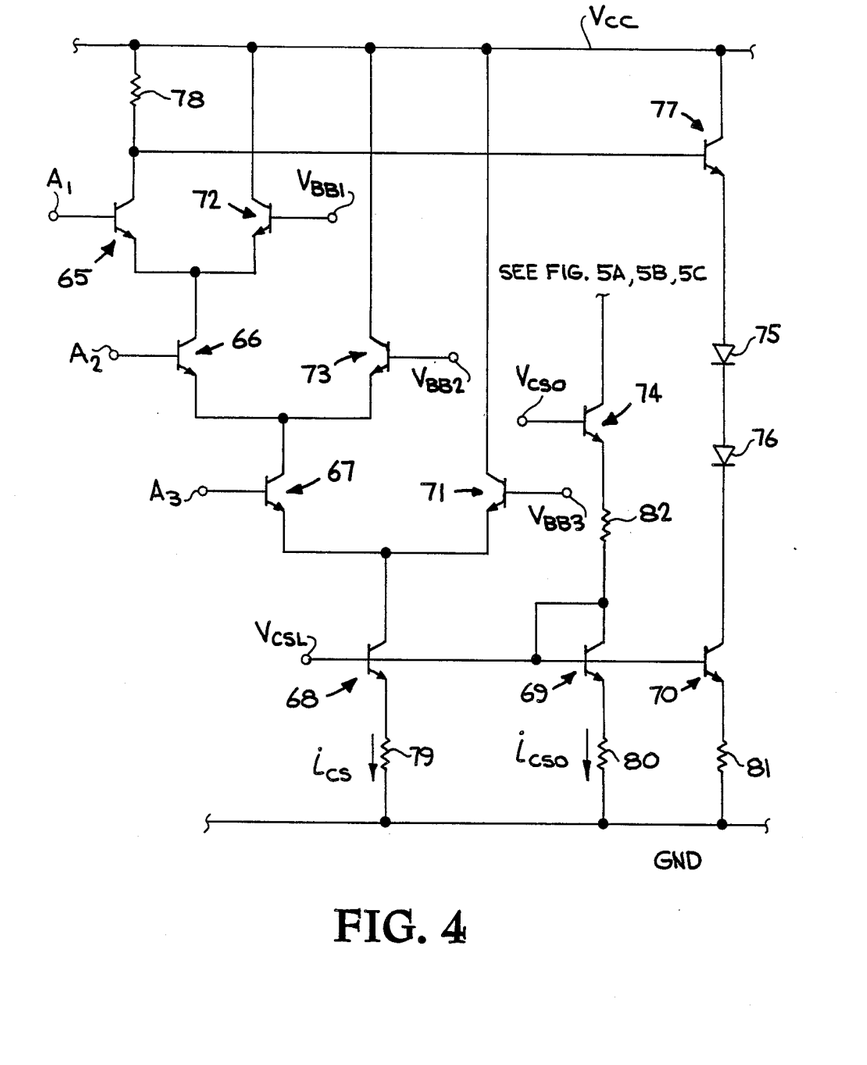
FIG. 4 is a circuit schematic of a three-level ECL gate employing a voltage source of the type of FIGS. 3(a) and 3(b) to drive a current source arrangement of the present invention.

The current source arrangement of the present invention provides the low drop current source by first supplying a low reference voltage $V_{CSL}$ in place of the conventional bandgap reference voltage $V_{CS}$. The low reference voltage $V_{CSL}$, shown on the bases of transistors 68, 69 and 70 in FIG. 4, is generated by various means. Preferably it is provided locally so as to not have to distribute it through a network and thereby incur voltage drops in the distribution lines. FIGS. 3(a) and 3(b) illustrate a preferred means to generate a voltage $V_{CSO}$ which is used to produce the low reference voltage $V_{CSL}$ which drives the low drop current source. $V_{CSO}$ is generated by tapping a conventional bandgap reference voltage generator at a nonconventional point. Bandgap reference voltage generators are available on all ECL integrated circuits. See, e.g., A. H. Seidman, *Integrated Circuits Applications Handbook*, p. 498 (Wiley 1983). They are used to provide a reference voltage $V_{CS}$, shown for example on output line 59 in FIG. 3(a), which normally regulates the base voltage of the current source transistor as well as $V_{BB1}$ and $V_{BB2}$, the signal reference voltages. $V_{CS}$ is set at 1.6 volts at 25° C. and varies between 1.3 and 1.75 volts over the military temperature range because it is designed to be a few mv over a $V_{BE}$ plus $V_S$ so as to generate a voltage swing, $V_S$, across the load resistor which closely matches the current source emitter resistor. It is not possible to produce a low drop current source with such a driving voltage because this voltage is too high to make $V_{CSD}$ equal to 0.325 volts. However, if a new reference voltage, shown as $V_{CSO}$, in FIGS. 3(a) and 3(b) is generated which is one base-to-emitter voltage, $V_{BE}$, above $V_{CS}$, then a low drop current source can be fabricated which is suitable for producing three-level series-gated ECL or four-level series-gated CML. As described in detail with respect to FIG. 4, $V_{CSO}$ is one $V_{BE}$ above $V_{CS}$ but is stepped down by the component string of transistor 74, resistor 82, diode-connected transistor 69 and resistor 80 so that a low reference voltage $V_{CSL}$ may be applied to drive the base of current source transistor 68. As shown, $V_{CSO}$ is available on the emitter of transistor 49 and can be taken on output line 58. In a preferred embodiment, shown in FIG. 3(b), $V_{CSO}$ is not taken from the bandgap reference voltage generator in a manner that could interfere with the generation of $V_{CS}$ which may still be required for use in other parts of the integrated circuit. Instead, an additional transistor 60 and resistor 62 are provided as shown between the $V_{CC}$ line and ground. The base of transistor 60 is connected to node a (the node whose potential is also applied to the base of transistor 49) and since the values of resistors 62 and 54 are chosen to be equal, the current through transistor 60 will mirror the current through transistor 49. Thus, $V_{CSO}$ may be taken from output line 61 and will be one $V_{BE}$ above $V_{CS}$ which is still taken on output line 59. Another approach to generate a low bias to drive a low drop current source is described in the copending H. Varadarajan application referenced above. Typically, a single means for generating $V_{CSO}$ can fan out to drive a number of means to generate a low reference voltage of the type described subsequently.

In a conventional ECL gate or series-gated structure, the bandgap reference voltage, $V_{CS}$, is applied to the base of the current source transistor, e.g., transistor 68 in FIG. 4. However, in the low drop current source shown with the circuit arrangement of the present invention, $V_{CSO}$ is stepped down so that a low reference voltage $V_{CSL}$ is applied to the base of current source transistor 68 thereby producing a low drop current source. Basically, the current $i_{CSO}$ through diode-connected transistor 69 is mirrored in current source transistor 68. As shown in FIG. 4, $V_{CSO}$ is applied to the base of transistor 74 thereby bringing the voltage level down to that of $V_{CS}$ as it appears on resistor 82. As with conventional current sources the current through resistor 82 and diode-connected transistor 69 will be well defined because $V_{CSO}$ is one $V_{BE}$ above $V_{CS}$ and was dropped by transistor 74 before going through the resistor and $V_{BE}$ combination. The current through transistor 69 is mirrored in transistors 68 and 70. Exact mirroring occurs if the transistors are chosen to have emitter areas of the same size. In an alternative embodiment, the emitter area of transistor 69 is a fraction m/n of the emitter area of transistors 68 and 70 so that a unit of current in transistor 69 produces n/m times the current in transistors 68 and 70. Choosing m/n to be less than one, preferably ½ or less, conserves the current used (in transistors 69, 74 and resistors 82 and 80) to generate the low voltage drop current source (transistor 68, resistor 79). Since the voltage $V_{CSL}$ on the base of transistor 68 is controllably low, the voltage drop can be low across transistor 68 and resistor 79. Thus, the voltage drop across the current source (transistor 68, resistor 79) can be designed to be less than 0.325 volts so that adequate voltage is left for three levels of logic to be stacked above transistor 68. Resistors 79 and 81 are not required but ensure better tracking of the mirror current through diode-connected transistor 69, transistors 68 and 70, countering $V_{BE}$ differences and ground drops. No more than 50-100 mv has to be allocated to resistors 79 and 81 to enhance the tracking of the mirror current, since it is important not to saturate transistors 68 and 70.

Figure 5A:
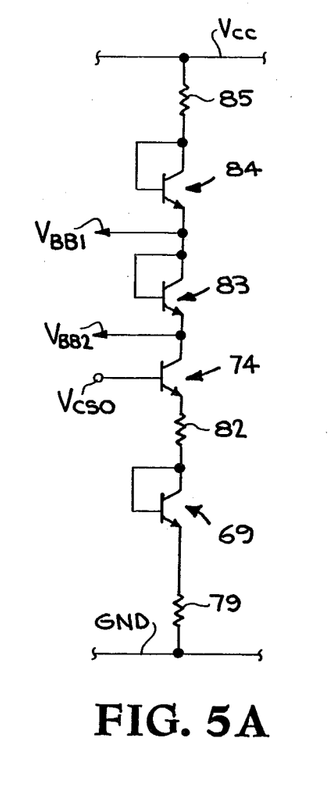
FIGS. 5(a)-5(c) are schematic diagrams illustrating various ways in which the additional current available from the low drop current source arrangement of the present invention may be utilized.
Figure 5B:
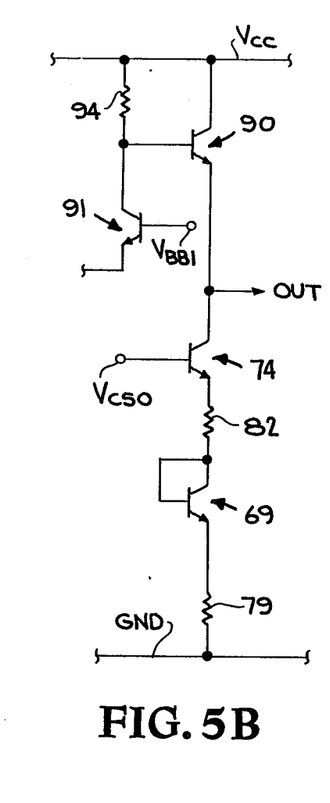
Figure 5C:
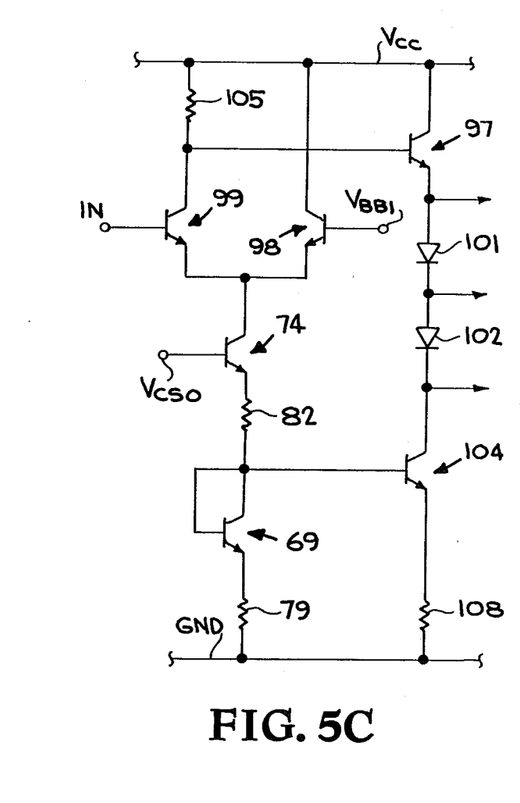

Since the low drop current source (transistors 68, resistor 79 in FIG. 4) requires the use of a separate string of components between $V_{CC}$ and ground (transistor 74, resistor 82, transistor 69 and resistor 80 in FIG. 4), a current $i_{CSO}$, through the string is available. The magnitude of $i_{CSO}$ is determined by $V_{CSO}$ which is impressed on the base of transistor 74 and influences the current through transistor 74 and resistors 80 and 82. The $i_{CSO}$ current may be usefully applied. Several uses are shown in FIGS. 5(a) to 5(c). In each case, the component string shown for producing $V_{CSO}$ (transistor 74, resistor 82, transistor 69 and resistor 80) is connected to additional circuitry which accomplishes a useful function. For example, as shown in FIG. 5(a), $V_{BB1}$ and $V_{BB2}$ are generated adjacent to the gate in which they are used, thereby eliminating the distribution of these reference voltages which saves the area normally dedicated to distribution lines and avoids distribution line drops. The value of resistor 85 and the sizes of each of the diode-connected transistors 84 and 83 is chosen so that the voltages on their respective emitters is at the appropriate levels for $V_{BB1}$ and $V_{BB2}$. A second use of $i_{CSO}$ is shown in FIG. 5(b), where it is used as the load current source for one of the output emitter followers 90 of an adjacent ECL gate having a reference transistor 91 and a voltage swing determining resistor 94. And, in FIG. 5(c) a third use is shown which allows the construction of another level of logic which would be superimposed on the logic performed by the three-level series-gating scheme. Here, the output of the three-level gate is fed to the additional gate which has its own current source and resistor, thus adding more functions to the circuit of FIG. 4.

Figure 6:
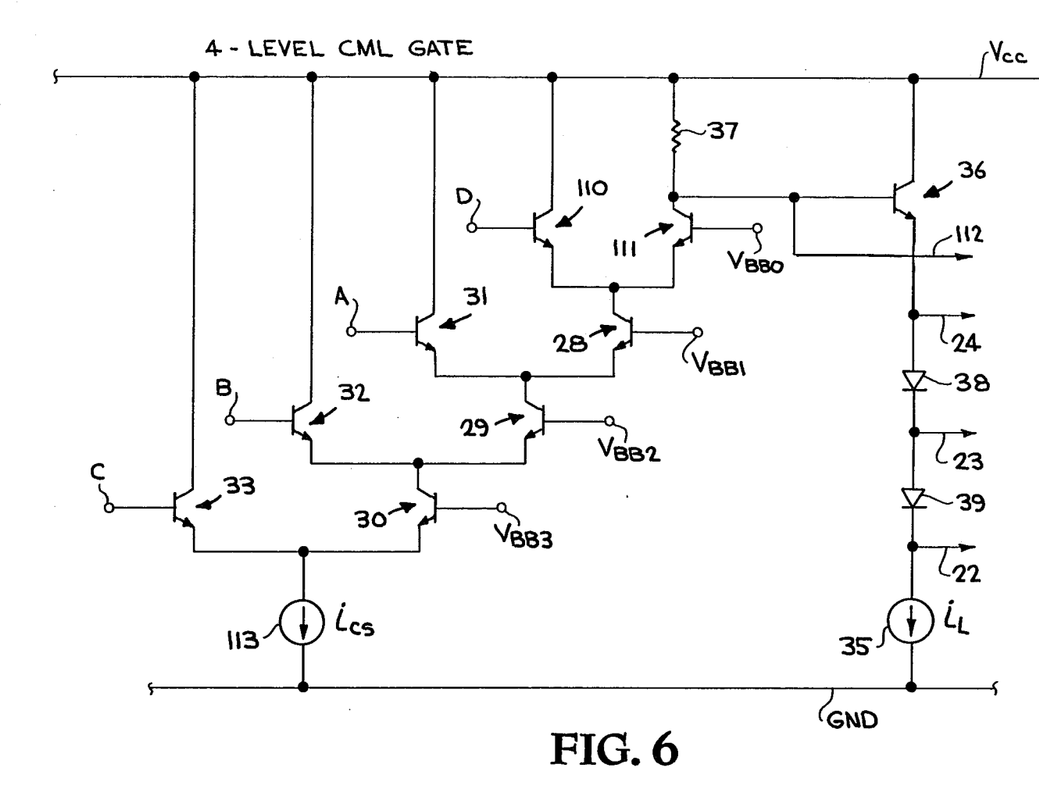
FIG. 6 is a schematic diagram of a four-level, series-gated current mode logic circuit.

Current mode logic is a closely related logic form to emitter-coupled logic. It is often confused with emitter coupled logic, with the nomenclature ECL and CML often being used interchangeably. Properly defined, CML is an ECL gate without emitter followers. A four-level CML gate is shown in FIG. 6. Essentially a fourth level of logic has been added to the three levels of FIG. 3. The fourth level consists of input transistor 110 and reference transistor 111 but has no emitter follower. Instead, the output 112 is taken directly from the collector of reference transistor 111. CML is not as widely used as ECL because of saturation problems at high temperatures. Four levels of logic are possible with a CML gate implemented with the low drop current source of the present invention since the output can also be taken from the top collector load resistor and directly fed to the input of the next stage as shown in FIG. 6. The lower levels are, of course, fed from emitter followers and translation diodes. The voltage swing is necessarily restricted to 400-450 mv to prevent saturation of the input transistor. A fourth level would alternately be stacked on input transistors 33, 32 or 31. The four-level gate can produce any Boolean function of four inputs or their combinations by wired AND functions. The key is that current source 113 be a low drop current source which consumes less than 0.1 of the voltage span between $V_{CC}$ and ground.

The foregoing description of a preferred embodiment of the invention has been presented for purposes of illustration and description. It is not intended to be exhaustive or to limit the invention to the precise form disclosed, and obviously many variations are possible for the means to generate the low drop current source or for the ways to utilize the current $I_{CSO}$. The three-level ECL series-gated embodiment was chosen in order to best explain the principles of the invention and its practical application to thereby enable others skilled in the art to best utilize the invention in various embodiments and with various modifications as are suited to the particular use contemplated. The principles apply to four-level CML as well. It is intended that the scope of the invention be defined by the claims appended hereto.

What is claimed is:

1. A current source arrangement for producing a series-gated logic circuit of order higher than two, the logic circuit having a $V_{CC}$ voltage supply line and a $V_{EE}$ voltage supply line, comprising:
   a current source connected to the $V_{EE}$ voltage supply line,, said current source having a voltage drop which consumes less than one-tenth of the total voltage span between the $V_{EE}$ voltage supply line and the $V_{CC}$ voltage supply line;
   a first array of transistors connected to form a first level of logic, said first array being connected to said current source;
   a second array of transistors connected to form a second level of logic connected to said first array of transistors; and
   at least one additional array of transistors connected to form at least one additional level of logic, said at least one additional array being connected between said second array and said $V_{CC}$ voltage supply line.

2. A current source arrangement in accordance with claim 1 wherein said current source comprises:
   a current source transistor having an emitter, a base connected to receive a low voltage $V_{CSL}$, with respect to the $V_{EE}$ voltage supply line, and having a collector connected to a first common emitter node of the transistors in said first array of transistors; and
   a current source resistor connected between the emitter of said current source transistor and the $V_{EE}$ voltage supply line.

3. A current source arrangement in accordance with claim 2 including:
   means for generating the low voltage $V_{CSL}$ including a series connected component string consisting of a first transistor, having a collector coupled to the $V_{CC}$ voltage supply line, a base connected to receive a current reference voltage $V_{CSO}$ and an emitter connected to a first node, a first resistor connected from the first node to a second node, a diode-connected transistor having a common base-collector connection connected to the second node and having an emitter connected to a third node, and a second resistor connected from the third node to the $V_{EE}$ voltage supply line, the voltage $V_{CSL}$ being taken from the second node.

4. A current source arrangement in accordance with claim 3 further including:
   means for generating the current reference voltage, $V_{CSO}$, including a bandgap reference voltage generator for generating the conventional bandgap reference voltage, $V_{CS}$, and means for generating the current reference voltage, $V_{CSO}$, one base to emitter voltage, $V_{BE}$ above the conventional bandgap reference voltage, $V_{CS}$.

5. A current source arrangement in accordance with claim 3 wherein the ratio of the emitter area m of said diode-connected transistor to the emitter area n of said current source transistor is given by m/n whereby a unit of current in said diode-connected transistor produces n/m units of current in said current source transistor.

6. A current source arrangement in accordance with claim 4 wherein said means for generating the current reference voltage, $V_{CSO}$, includes at least one transistor having an emitter connected to receive the conventional bandgap reference voltage, $V_{CS}$, and a collector coupled to the $V_{CC}$ voltage supply line whereby the current reference voltage $V_{CSO}$ is available on a base of said at least one transistor and is supplied to the base of said first transistor in said component string.

7. A current source arrangement in accordance with claim 3, 4, 5 or 6 in combination with a series of additional diode-connected transistors coupled between the collector of said first transistor of said component string and said $V_{CC}$ voltage supply line whereby local reference voltages are generated for each of said additional diode-connected transistors.

8. A current source arrangement in accordance with claim 3, 4, 5 or 6, in combination with an ECL gate generating an output and having an emitter follower transistor with a collector coupled to the $V_{CC}$ supply line, a base coupled to receive the output from the ECL gate and an emitter coupled to an output supply line, wherein the collector of said first transistor in said component string is connected to supply current through the emitter of the emitter follower transistor.

9. A current source arrangement with claim 3, 4, 5 or 6 in combination with a second additional array of transistors including:
    at least one input transistor having an emitter connected to a second additional common emitter node, a base connected to receive an input signal and a collector coupled to the $V_{CC}$ voltage supply line, and
    a reference transistor having an emitter coupled to the second additional common emitter node, a base coupled to a base reference supply voltage and a collector coupled to the $V_{CC}$ voltage supply line,
    wherein the collector of said first transistor of said component string is coupled to supply current at the second additional common emitter node and further including
    an emitter follower transistor having a base connected to one of the collector of the at least one input transistor or the collector of the reference transistor, a collector coupled to the $V_{CC}$ voltage supply line, and an emitter coupled to supply an output voltage; and
    a load current source transistor having a collector coupled to the emitter of the emitter follower transistor, a base coupled to the second node of the component string, and an emitter coupled to the $V_{EE}$ voltage supply line.

10. The current source arrangement of claim 1, 2, 3, 4, 5 or 6 wherein:
    said first array of transistors includes at least a first input transistor having a base connected to receive an input signal, an emitter connected to a first common emitter node, and a collector connected to a first input collector node and a first reference transistor having an emitter connected to the first common emitter node, a base connected to a first base reference voltage and a collector connected to a first reference collector node;
    said second array of transistors includes at least a second input transistor having an emitter connected to a second common emitter node, a base connected to receive an input signal and a collector connected to a second input collector node and a second reference transistor having an emitter coupled to the second common emitter node, a base coupled to a second base reference voltage and a collector connected to a second reference collector node;
    said at least one additional array of transistors includes at least one additional input transistor having a base connected to receive an additional input signal, an emitter connected to an additional common emitter node and a collector coupled to an additional input collector node and an additional reference transistor having an emitter connected to the additional common emitter node, a base connected to an additional base reference voltage and a collector connected to an additional reference collector node; wherein
    one of the first input collector node or first reference collector node being connected to the second common emitter node, one of the second input collector node or the second reference collector node being connected to the additional common emitter node, and one of the additional input collector node or the additional reference collector node being connected to the $V_{CC}$ voltage supply line; and including
    a resistor connected from an output node, the output node being the order of the additional input collector node or the additional reference collector node, to the $V_{CC}$ voltage supply line.

11. A current source arrangement in accordance with claim 10, further including:
    an emitter follower transistor having a base connected to the output node, a collector connected to the $V_{CC}$ voltage supply line and an emitter connected to supply an output voltage to a first output line.

12. A current source arrangement in accordance with claim 11, further including at least two diodes, each having an anode and a cathode, connected in series with the anode of the first series diode connected to the emitter of the emitter follower transistor and the cathode of the last series diode connected to a load current source whereby the first output line at the emitter of the emitter follower transistor, a second output line at the cathode of the first series diode and a third output line at the cathode of the second series diode provide respectively outputs corresponding to each of the levels of logic.

13. A current source arrangement in accordance with claim 12 in combination with a load current source transistor having an emitter coupled to the $V_{EE}$ voltage supply line, having a base connected to the low voltage $V_{CSL}$, and having a collector coupled to supply load current through the emitter of the emitter follower transistor and the at least two diodes.

14. A current source arrangement in accordance with claim 13 in combination with a resistor between the emitter of said load current source transistor and the $V_{EE}$ voltage supply line.

15. A current source arrangement in accordance with claim 11 in combination with a load current source transistor having an emitter coupled to the $V_{EE}$ voltage supply line, having a base connected to said low voltage $V_{CSL}$, and having a collector coupled to supply load current through the emitter of the emitter follower transistor.

16. A current source arrangement in accordance with claim 15, in combination with a resistor between the emitter of said load current source transistor and ground.

17. A low drop current source supplying current for a circuit connected between a $V_{CC}$ voltage supply line and a $V_{EE}$ voltage supply line comprising:
   a current source transistor having a collector connected to supply the current, a base and an emitter;
   a current source resistor connected between the emitter of said current source transistor and the $V_{EE}$ voltage supply line,; and
   a low reference voltage source connected to the base of said current source transistor;
   wherein said low reference voltage source supplies a voltage such that a voltage from the collector of the current source transistor to the $V_{EE}$ voltage supply line less than one-tenth of the voltage span between the $V_{CC}$ voltage supply line and the $V_{EE}$ voltage supply line, does not saturate the current source transistor.

18. A low drop current source supplying current for a circuit connected between a $V_{CC}$ voltage supply line and a $V_{EE}$ voltage supply line, comprising:
   a current source transistor having a collector connected to supply the current, a base and an emitter;
   a current source resistor connected to the emitter of said current source transistor and the $V_{EE}$ voltage supply line; and
   a low reference voltage source connected to the base of said current source transistor;
   wherein said low reference voltage source comprises a series-connected component string including:
   a first transistor having a collector, a base and an emitter;
   a first resistor;
   a diode-connected transistor having a collector, a base connected to the collector and an emitter;
   and a second resistor;
   wherein the collector of the first transistor is coupled to the $V_{CC}$ voltage supply line, the base of the first transistor is connected to a current reference voltage, $V_{CSO}$, the first resistor is connected from the emitter of the first transistor to the connected base and collector of the diode-connected transistor, and the second resistor is connected from the emitter of the diode-connected transistor to the $V_{EE}$ voltage supply line; and
   the low reference voltage is supplied by the connected base and collector of the diode-connected transistor.

19. The low drop current source of claim 18, further including:
   means for supplying the current reference voltage $V_{CSO}$, including a bandgap reference voltage generator generating a bandgap reference voltage, $V_{CS}$, and means for generating the current reference voltage $V_{CSO}$ such that it is one base to emitter voltage drop above the bandgap reference voltage $V_{CS}$.

* * * * *